(12) United States Patent
Han (10) Patent No.: US 8,489,050 B2
(45) Date of Patent: Jul. 16, 2013

(54) METHOD FOR TUNING TO A RADIO BROADCAST FREQUENCY IN A PORTABLE TERMINAL

(75) Inventor: Kyu Sung Han, Gyeongsangbuk-do (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 325 days.

(21) Appl. No.: 12/629,236

(22) Filed: Dec. 2, 2009

(65) Prior Publication Data

US 2010/0144294 A1    Jun. 10, 2010

(30) Foreign Application Priority Data

Dec. 4, 2008    (KR) .................. 10-2008-0122379

(51) Int. Cl.
*H04B 1/18*    (2006.01)

(52) U.S. Cl.
USPC ............... 455/186.1; 455/3.01; 455/161.3; 455/150.1; 455/154.1; 455/158.1

(58) Field of Classification Search
USPC ............. 455/186.1, 3.1, 161.3, 150.1, 154.1, 455/158.1
See application file for complete search history.

(56) References Cited

U.S. PATENT DOCUMENTS

| | | | |
|---|---|---|---|
| 6,266,816 B1 * | 7/2001 | Watson et al. | 725/120 |
| 7,869,779 B2 * | 1/2011 | Walley et al. | 455/161.3 |
| 2007/0010221 A1 * | 1/2007 | Howard et al. | 455/179.1 |

* cited by examiner

*Primary Examiner* — Sanh Phu
(74) *Attorney, Agent, or Firm* — Cha & Reiter, LLC (57) ABSTRACT

A method for tuning to a radio broadcast frequency in a portable terminal is disclosed. The method includes: determining whether a condition for requiring tuning information is satisfied; computing tuning information using received signal strength indication (RSSI) values of signals received by frequencies if a condition for requiring tuning information is satisfied; and tuning to a radio broadcast frequency corresponding to a radio broadcasting requested by a user, using the computed tuning information, and receiving radio broadcast signals. The tuning information includes: a threshold of RSSI serving as a reference value determine the presence of a radio broadcasting channel; and a Signal-to-Noise Ratio (SNR) value to minimize noise levels.

20 Claims, 5 Drawing Sheets

|  | Threshold | SNR |
|---|---|---|
| GERMANY | 4 | 0 |
| CHINA | 4 | 1 |
| ⋮ | ⋮ | ⋮ |

FIG . 5

METHOD FOR TUNING TO A RADIO BROADCAST FREQUENCY IN A PORTABLE TERMINAL

CLAIM OF PRIORITY

This application claims the benefit of the earlier fling date, pursuant to 35 USC 119, to that patent application entitled "METHOD FOR TUNING A RADIO BROADCAST FREQUENCY AND PORTABLE TERMINAL THEREFOR" filed in the Korean Intellectual Property Office on Dec. 4, 2008 and assigned Serial No. 10-2008-0122379, the contents of which are incorporated herein by reference.

BACKGROUND OF THE INVENTION

1. Field of the Invention

The present invention relates to radio receiving systems, and more particularly, to a method for tuning a receiving system to a radio broadcast frequency in a portable terminal.

2. Description of the Related Art

In general, radio broadcasting is an audio broadcasting service provided in such a way that a plurality of radio stations broadcast radio broadcast signals through the air and a radio broadcast receiver receives a broadcast signal corresponding to a user's selecting frequency via an antenna and outputs an audio sound to a speaker. The radio broadcast receiver includes a tuner that tunes to one of the broadcasting frequencies according to a user's selection, so that only a radio broadcast signal corresponding to the selected broadcast frequency can be received and then output. That is, the tuner serves to allow the receiver to receive only one of the radiowaves (broadcast signals) from a plurality of radio stations, which corresponds to a user's selected frequency band.

The types of radio broadcasting are amplitude modulation (AM) broadcasting and frequency modulation (FM) broadcasting. FM broadcasting is advantageous in that it can serve as stereo broadcasting and provide higher sound fidelity. FM broadcasting is more popular due to its advantages. However, FM broadcasting is disadvantageous in that it has a limited broadcast range. In order to perform nationwide FM broadcasting, a central FM station broadcasts FM radiowaves to local FM stations, and then the local FM stations broadcast them to corresponding areas, so that the FM radio receivers can receive the FM radio signals and provide audio sounds to users.

With the development of wireless communication technology, portable terminals now provide a variety of services, such as short message service (SMS), multimedia messaging service (MMS), video call service, digital media broadcasting (DMB) service, wireless Internet service, etc. as well as a voice call service. In recent years, portable terminals have included a radio broadcast receiver to provide radio broadcasts to users. In that case, the portable terminals may store information regarding a variety of elements to retain a high quality audio sound according to local areas. An example of the stored information is a tuning element that can tune a radio broadcast frequency in a reference local area and allow the radio broadcast receiver to receive a radio broadcast signal corresponding thereto.

Although the tuning element allows the receiver to receive radio broadcast signals from a plurality of radio stations, its operation information is fixed to a particular area, as a reference area, and then stored in the portable terminal. For example, a portable terminal manufactured for use in Europe may fix the tuning element to Germany, for example, as a reference area to check the radio quality and store the information related to the tuning element, so that the receiver can optimally receive radio broadcast signals from German radio broadcasting stations. However if a user takes the portable terminal to another country, such as Italy, for example, and then intends to listen to the radio signals, it starts to receive radio broadcast signals broadcast from Italian radio broadcasting stations through the tuning element fixed to a German radio broadcasting area, and then outputs the received signals. However, since an environment for receiving radio broadcast signals in Italy differs from that in Germany, the radio broadcast receiver may not provide a high quality audio sound when the user listens to the radio in this second country (e.g. Italy).

Therefore, a radio receiving system is required to be adaptively changed to radio broadcasting environments depending on where the receiving system is located and to provide high quality radio broadcasts to users wherever users listen to the radio.

SUMMARY OF THE INVENTION

In accordance with an exemplary embodiment of the present invention, the present invention provides a method for tuning to a radio broadcast frequency, including: determining whether a condition for requiring tuning information is satisfied; computing tuning information using received signal strength indication (RSSI) values of signals received within a desired frequency band if a condition for requiring tuning information is satisfied; and tuning to a radio broadcast frequency corresponding to a radio broadcasting requested by a user, using the computed tuning information, and receiving radio broadcast signals based on the tuning information. The tuning information includes: a threshold of RSSI serving as a reference value to determine a radio broadcasting channel; and a Signal-to-Noise Ratio (SNR) value to minimize noise levels. The condition for requiring tuning information is determined based on whether a portable terminal with a radio function is moved to local areas where the tuning information is changed.

In accordance with another exemplary embodiment of the present invention, the present invention provides a portable terminal including: a radio broadcast receiver for receiving radio broadcast signals through a tuned frequency; a radio frequency (RF) communication unit for performing communication with a connectable service network, or a current service network; a storage unit for storing tuning information, computed using RSSI values of signals received by frequencies, in a table; and a controller for determining whether a condition for requiring tuning information is satisfied, computing the tuning information if a condition for requiring tuning information is satisfied, and tuning to a radio broadcast frequency corresponding to a radio broadcast signal requested by a user, using the computed tuning information.

BRIEF DESCRIPTION OF THE DRAWINGS

The features and advantages of the present invention will become more apparent from the following detailed description in conjunction with the accompanying drawings, in which.

DETAILED DESCRIPTION OF THE INVENTION

Exemplary embodiments of the present invention are described in detail with reference to the accompanying drawings. The same reference numbers are used throughout the drawings to refer to the same or similar parts. For the purposes of clarity and simplicity, detailed descriptions of well-known functions and structures incorporated herein may be omitted to avoid obscuring the subject matter of the present invention.

The present invention proposes a method for obtaining, applying and changing tuning information to receive radio broadcast signals in each country to resolve conventional problems caused when a radio broadcast receiver receives radio broadcast signals in each country using fixed tuning information that may differ in each country.

Figure 1:
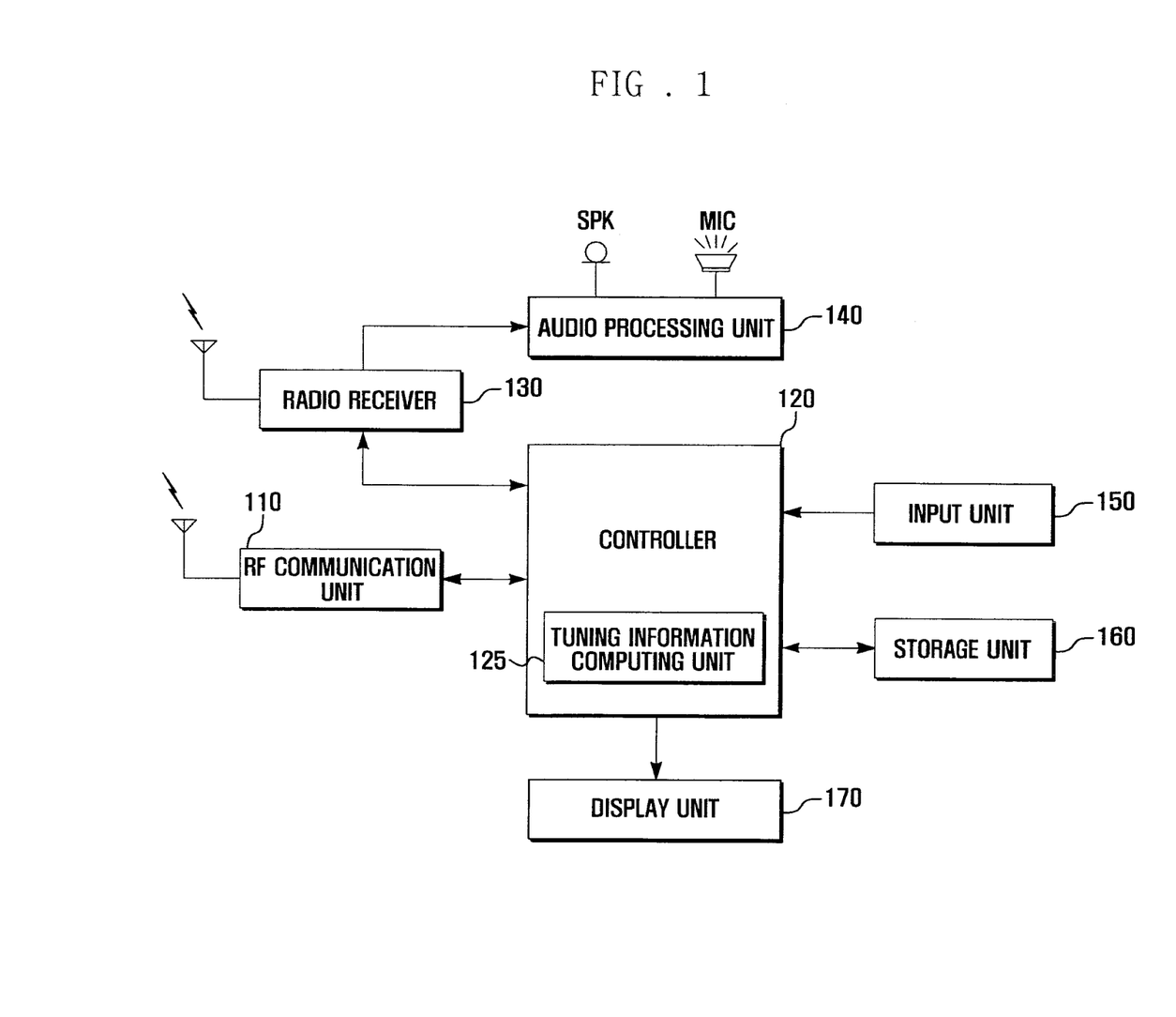
FIG. 1 is a schematic block diagram illustrating a portable terminal having a radio function, according to an embodiment of the present invention.

FIG. 1 is a schematic block diagram illustrating a portable terminal having a radio function, according to an embodiment of the present invention.

Referring to FIG. 1, the portable terminal 100 includes an RF communication unit 110, a controller 120, a radio receiver 130, an audio processing unit 140, an input unit 150, a storage unit 160, and a display unit 170.

The RF communication unit 110 performs RF communication with a base station of a connectable service network (not shown), by transmitting and receiving RF signals. The RF communication unit 110 transforms digital signals to base-band signals, up-converts and amplifies them, and then transmits the processed signals via an antenna. RF communication unit 100 also receives signals via the antenna, down-converts and low-noise amplifies the received signals, transforms the processed signals to digital signal outputs, and then outputs the digital signals to controller 120.

The controller 120 controls the operation of the portable terminal 100. That is, it controls the signal flow among the elements in the portable terminal 100. The controller 120 processes data output from the RF communication unit 110, numerical and character data that a user inputs through the input unit 150, and voice data from the audio processing unit 140. The controller 120 may include modulator-demodulator (MODEM) (not shown) for coding and modulating signals to be transmitted and for demodulating and decoding received signals. The controller 120 may also include a coder-decoder (CODEC) (not shown) for processing audio data packets and an audio codec for processing audio data.

The controller 120 determines whether the condition(s) for requiring tuning information is satisfied. If the controller 120 ascertains that the condition(s) for requiring tuning information is satisfied, it computes the tuning information using Received Signal Strength Indication (RSSI) values of signals associated with a plurality of frequencies within one or more known frequencies ranges. For example, AM frequencies operate in the band of 520-1610 KHz and FM frequencies operate in the band of 88.0-108.0 MHz. If the user requests radio broadcasting, the controller 120 tunes to a frequency corresponding to the requested radio broadcasting channeling using the computed tuning information.

The controller 120 may further include a tuning information computing unit 125 for obtaining and/or computing tuning information.

In an embodiment of the present invention, the term 'tuning information' includes a threshold of Received Signal Strength Indication (RSSI) and a Signal-to-Noise Ratio (SNR) value to minimize noise levels. The threshold of RSSI refers to a reference value for which radio broadcasting channels may be deemed to provide acceptable reception.

Satisfying the condition(s) for requiring tuning information means that a portable terminal user moves from one area to another area, so that tuning information is needed to be changed. That is, the condition(s) for requiring tuning information is satisfied by movement between base stations.

The radio receiver 130 receives radio broadcast signals broadcast from radio stations, through a frequency tuned according to a user's selection, amplifies the received signals, and outputs the received signals to the audio processing unit 140. The radio receiver 130 may include a tuner for tuning to a frequency according to a frequency selection signal from the controller 120, and an amplifier for amplifying input signals to output an audible sound through speaker SPK.

The audio processing unit 140 reproduces audio data from an audio codec of the controller 120 or the radio receiver 130 to output audible sounds through the speaker SPK. It also inputs audio data via a microphone MIC and outputs them to the controller 120.

The input unit 150 is composed of character keys, numerical keys, a variety of function keys, etc. It may be implemented with a keypad, a touchpad, etc. It generates key signals corresponding to user's input keystrokes and outputs them to the controller 120.

Figure 4:
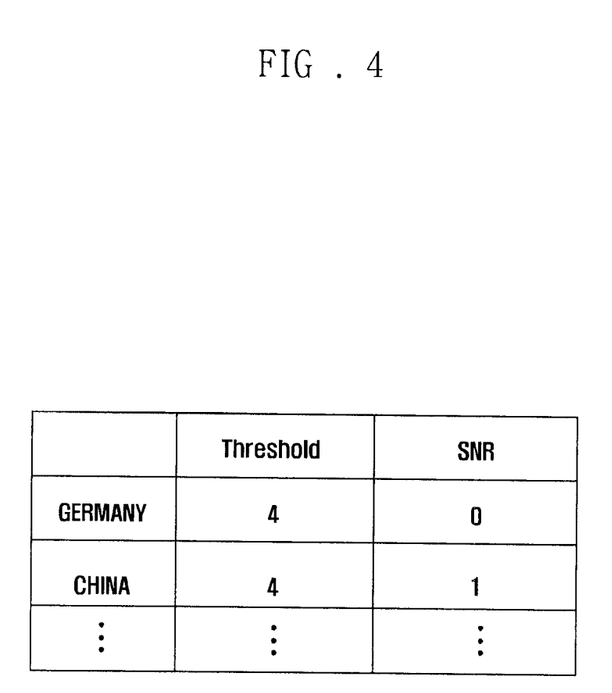
FIG. 4 is a tuning information table according to an embodiment of the present invention.

The storage unit 160 stores application programs for operating a variety of functions of the portable terminal 100 and data generated as they are executed. The storage unit 160 stores a tuning information table containing computed tuning information, as shown in FIG. 4. The tuning information table contains local information, thresholds, and SNRs.

The display unit 170 displays data generated as the portable terminal 100 is operated. It may be implemented with a liquid crystal display (LCD). In one aspect, the display unit 170 may further include an LCD controller, a buffer, an LCD device, etc.

Figure 2:
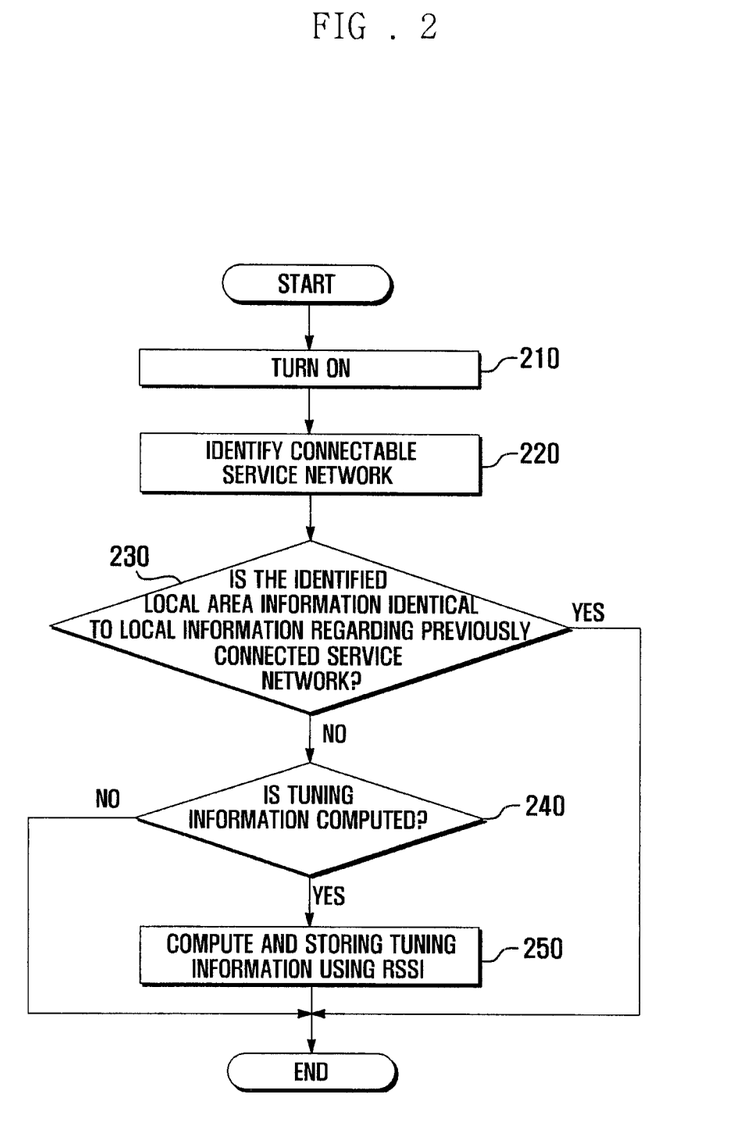
FIG. 2 is a flow chart that describes an embodiment of a method for computing tuning information, according to the present invention.

FIG. 2 is a flow chart that describes an embodiment of a method operable in the controller 120 for computing tuning information, according to the present invention.

Referring to FIG. 2, when the portable terminal '100 is turned on (210), the controller 120 identifies a connectable service network to determine whether the condition for requiring tuning information is satisfied, or whether the portable terminal 100 is moved among base stations, (220).

Portable terminals may install a subscriber identity module (SIM), or a SIM card, that stores subscriber identification information through which users can enjoy a variety of services, such as a subscriber authentication, billing, security function, etc. These portable terminals can perform communication via their initially registered communication service network. Although the portable terminals may be moved from one country to another country, they can also be linked to and perform communication through a communication service network, provided by the country into which the terminal as moved, using the identification information stored in the SIM. It should be understood that portable terminals may also use a universal SIM (USIM), or a USIM card.

Subscriber identification information may also be an international mobile subscriber identity (IMSI) stored in an SIM card or a USIM card. It may also be a temporary mobile subscriber identity (TMSI) or a packet temporary mobile subscriber identity (P-TMSI) allocated by the network to which the terminal was originally registered. In particular, the IMSI is composed of a maximum of 15 digits, three of which compose a mobile country code (MCC), two or three of which compose a mobile network code (MNC), and a maximum of 10 of which compose a mobile subscriber identifier number (MSIN). MCC and MNC serve to identify the subscriber's home network. Each of the networks managed by service providers has a unique MCC and MNC. If a roaming service is provided that allows a portable terminal to access a network, i.e., a visited network, other than a home network, the visited network analyzes a maximum of 6 digits of the MCC and MNC to identify the home network. Therefore, although the portable terminal with a SIM is moved among countries, it can access a service network provided by the visited country, using an IMSI or a TMSI or P-TMSI, and, thus, use a corresponding communication service. Since service networks offered by each country differ from each other, the portable terminal 100 can determine whether it is moved to from one country to another by detecting a connectable service network when it is turned on. That is, the portable terminal 100 can identify local area information, i.e., information regarding a visited country, from the service to which the terminal is connected.

The controller 120 next determines whether the identified local area information is identical to the identified local area information of a network that of the terminal was previously connected service network (230). For example, the controller 120 determines whether a country offering a connectable service network is identical to a country offering a service network to which the portable terminal was connected. If the controller 120 ascertains that the identified local area information is identical to that of a previously connected service network at 230, the procedure to compute tuning information is terminated. Termination of the procedure means that the portable terminal 100 enters a standby state where it is waiting to execute other functions.

However, if the controller 120 ascertains that the identified local area information is not identical to that of the previously connected service network at 230, the terminal determines whether to compute tuning information required to receive radio broadcast signals in the new area (i.e., the newly visited country) (240). In one aspect of the invention, the determination as to whether to compute tuning information is displayed through a pop-up message on the display unit 170. Therefore, the user can determine the execution of computing tuning information through the input unit 150.

If the controller 120 ascertains that the user selects to compute tuning information at 240, the tuning information computing unit 125 of the controller 120 computes tuning information, required to receive radio broadcast signals, using RSSI values by frequencies (250). After the controller 120 ascertains that the user does select to compute tuning information at 240, it terminates the procedure of computing tuning information.

Although the embodiment is implemented to include step 240 where the determination whether to compute tuning information is performed according to a user's selection, it can be modified to remove the step 240. That is, the controller 120 may automatically determine tuning information based on the local area information if a condition for requiring tuning information is satisfied, i.e., the controller 120 identifies that the portable terminal 100 has moved from one country to another. Thus, tuning information may be automatically computed without requiring a user's input and the determined tuning information stored in the tuning information table.

In an embodiment of the present invention, 'tuning information' includes an RSSI threshold, serving as a reference value to permit reception of radio broadcasting channels, and a Signal-to-Noise Ratio (SNR) to minimize noise level. The tuning information contains local area information and is stored in the tuning information table, as shown in FIG. 4. A detailed description is provided regarding the process of computing the tuning information with reference to FIGS. 4 and 5.

FIG. 4 is a tuning information table according to an embodiment of the present invention.

Referring to FIG. 4, the table shows tuning information in Germany and China. That is, when local area information is acquired in Germany through a connectable or connected service network, the tuning information computed in Germany is as follows: threshold is four and SNR is zero. In addition, when local area information is acquired in China, threshold is four and SNR is one.

It should be understood that the tuning information table of FIG. 4 may further include fields to contain other information if they are required for the tuning information. That is, table according to an embodiment of the present invention, shown in FIG. 4, may be modified to further include other information.

Although the tuning information table 4 is configured, assuming that a ratio of effective radio broadcasting channels is adjusted by two factors, i.e., a threshold and an SNR, it would be recognized by those skilled in the art that the tuning information can also be implemented using other factors, e.g., a threshold, an SNR, and a impulse noise counter (CNT) value. That is, if a ratio of effective radio broadcasting channels is adjusted by a threshold, an SNR, and an impulse noise counter (CNT) value, the CNT value is added to the tuning information table of FIG. 4. Therefore, the tuning information table shown in FIG. 4 may contain other components if they serve to control a receiving state of radio broadcast signals.

Figure 5:
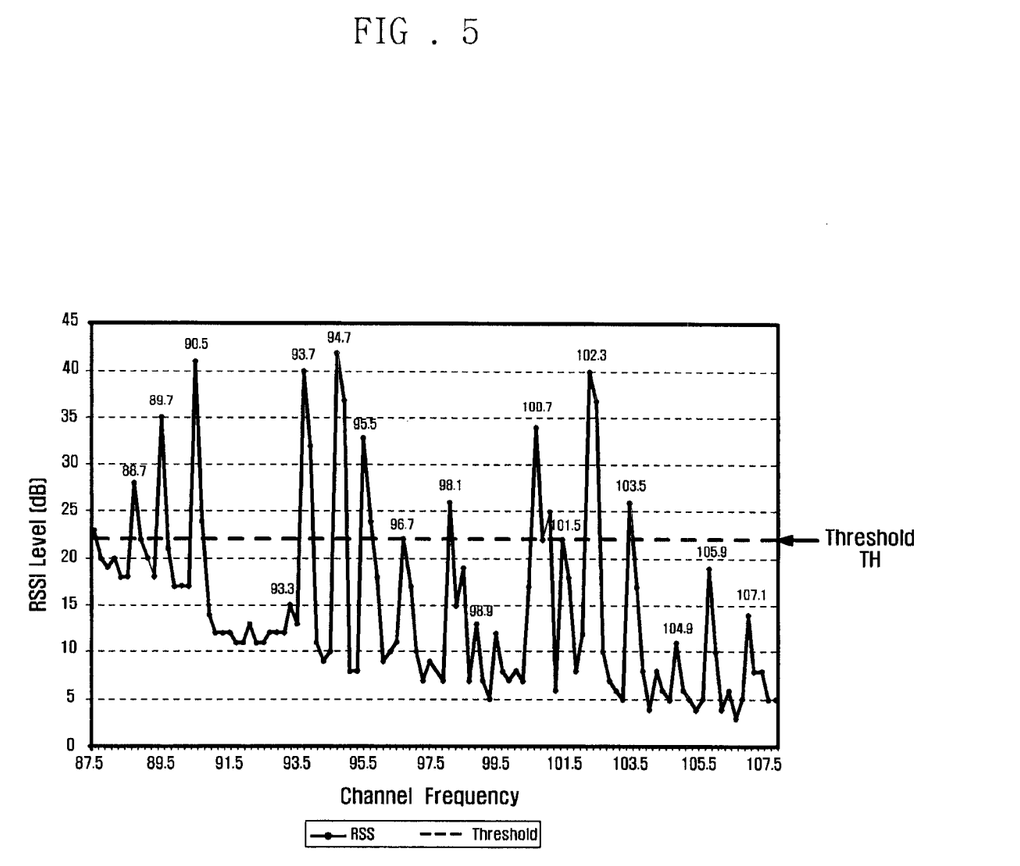
FIG. 5 is a graph illustrating an RSSI value vs. channel frequency graph according to an embodiment of the present invention.

FIG. 5 is a graph illustrating an RSSI value vs. channel frequency graph according to an embodiment of the present invention. It is assumed that the graph is acquired with respect to radio broadcast signals in a particular country. The received radio broadcast signals may be selected as radio channel frequencies if their RSSI is greater than the threshold TH that serves as a reference value to perform an effective radio broadcast channel.

There may be a variety of methods to receive signals broadcast from a plurality of radio broadcasting stations and select them as effective radio broadcasting channels if their RSSI is greater than a desired threshold value. In an embodiment of the present invention, the RSSI value refers to a value that can be received through an antenna of the radio receiver 130 shown in FIG. 1.

If RSSI values of signals received are the values shown in FIG. 5, one factor of the many factors affecting the quality of radio broadcasts, i.e., receiving quality, may be noise. Broadcast signals without noise allow the radio listener to enjoy a high quality radio broadcast. Noise level can be controlled by the difference between the RSSI value and SNR as shown in the following equation (1).

$$\text{Noise level} = \text{RSSI} - \text{SNR} \tag{1}$$

where $0 \text{ dB} \leq \text{SNR} \leq 127 \text{ dB}$.

If there is no noise, i.e., noise level is zero, the radio broadcasting reception environment is in an ideal state. Practically, if the noise level is minimized, the environment for the broadcast signal reception can be optimized.

As show in FIG. 5, if RSSI values are acquired according to frequencies and noise levels that are set to be a minimum, the SNR may affect the quality of broadcast signal. When the SNR value is high, the strength of a received signal is increased and the noise level is decreased. Therefore, the SNR needs to be a large value to minimize the noise level, thereby enhancing the radio broadcast signal reception environment and providing a high quality audio sound.

As described in equation (1), SNR values, serving as tuning information, can be acquired using the RSSI values of broadcast signals received with the desired frequency bands. The acquired SNR values, thresholds used for the selection of radio channels, and local area information acquired through a connectable or connected service network, are stored in the tuning information table shown in FIG. 4.

As described above, if a radio broadcasting reception environment is changed, tuning information, affecting the quality of audio sound in a radio broadcasting, is computed and thus a corresponding radio broadcast signal is received according to the computed tuning information, thereby providing a high quality broadcast to users.

Figure 3:
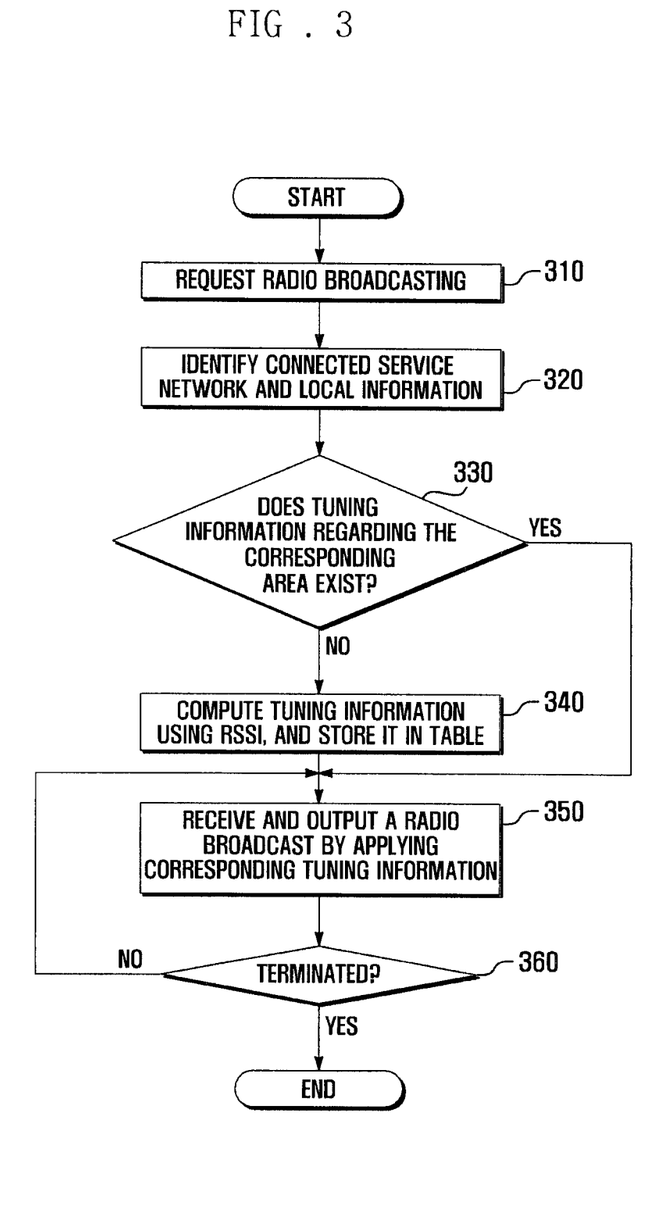
FIG. 3 is a flow chart that describes an embodiment of a method for computing tuning information, according to the present invention.

FIG. 3 is a flow chart that illustrates an exemplary embodiment of a method for computing tuning information, according to the present invention.

Referring to FIG. 3, if a user requests a radio broadcast from portable terminal 100 (310), the controller 120 identifies a service network connected to the portable terminal 100 and local area information (320). The local area information may include, for example, country information. As would be appreciated at the time that radio broadcasting is requested refers to a state where the portable terminal 100 has registered with a connectable service network and acquired information regarding the service network. Therefore, location area information, i.e., country information, can be acquired through the connected service network.

The controller 120 checks whether tuning information corresponding to the identified country is stored in the storage unit 160 (330). It would be recognized that it would be advantageous for the portable terminal to store within the tuning information in a table, i.e., a tuning information table in storage unit 160 whenever the portable terminal is in an identified country. In this manner, the portable terminal need not have to re-acquire tuning information if the portable terminal is turned off and on again within the same local area (see step 230, FIG. 2). If the controller 120 ascertains that tuning information corresponding to the identified country is not stored in the storage unit 160 at 330, the tuning information computing unit 125 of the controller 120 computes tuning information, i.e., thresholds and SNR values, using the RSSI values of broadcast signals received within the desired frequency range, and then stores these values with local area information in the tuning information table shown in FIG. 4 (340). The SNR values can be acquired to minimize noise, through the equation (1), using the RSSI values for each of the detected frequencies.

In an embodiment of the present invention, radio receiver 130 includes an antenna receiving radio broadcast signals which is well-known in the art and, hence, further explanation of the antenna installation process is omitted. The portable terminal 100, according to the present invention, may include an additional antenna, such as earphones with an electrical wire serving as an antenna, therein, which then receives radio broadcast signals. This technology is also well-known and need not be discussed in detail herein.

The controller 120 may next tune to a frequency corresponding to a user selected radio broadcasting channel using the tuning information associated with the corresponding local area, shown in FIG. 4, which allows the portable terminal to receive a broadcast signal operating at the tuned-to frequency (350). The received broadcast signal is then amplified and output through the speaker SPK, as previously discussed. That is, the portable terminal 100 can receive the radio broadcast signals by applying the tuning information to comply with an environment of a radio broadcasting reception in the country where it is located, and can output the audio sounds corresponding to the received signals. Therefore, it can improve the audio sound quality of radio broadcast signals and provide high quality audio sound to the user.

However, if the controller 120 ascertains that tuning information corresponding to the identified country is stored in the storage unit 160 at 330, the controller 120 proceeds with step 350 without performing step 340.

After outputting the broadcast signals at 350, the controller 120 determines whether a termination is requested (360). If the controller 120 ascertains that a termination has been requested at 360, the procedure is ended, otherwise it returns to and proceeds with step 350.

Therefore, although a portable terminal user moves to various countries, the portable terminal according to the present invention can compute tuning information to meet the radio broadcasting reception environment in a visited country where it is located, receive radio broadcast signals using the computed tuning information if the portable terminal user requests a radio broadcasting reception, and then provide high quality audio sound to the user, compared with the conventional systems that use fixed tuning information.

As described above, the system for tuning a radio broadcast frequency, according to the present invention, can provide high quality radio broadcasts to a user via the portable terminal, irrespective of the portable terminal user's location. If a radio broadcast receiving environment is changed, the system computes tuning information that may affect the radio broadcast quality of audio sounds and receives radio broadcast signals using the computed tuning information, so that the portable terminal user can enjoy high quality radio broadcasts whiling using a portable terminal having a radio function.

The above-described methods according to the present invention can be realized in hardware or as software or computer code that can be stored in a recording medium such as a CD ROM, an RAM, a floppy disk, a hard disk, or a magneto-optical disk or downloaded over a network, so that the methods described herein can be executed by such software using a general purpose computer, or a special processor or in programmable or dedicated hardware, such as an ASIC or FPGA. As would be understood in the art, the computer, the processor or the programmable hardware include memory components, e.g., RAM, ROM, Flash, etc. that may store or receive software or computer code that when accessed and executed by the computer, processor or hardware implement the processing methods described herein. As would be recognized by those skilled in the art, when a general purpose computer is loaded with, or accesses, software or code for implementing the processing shown herein, the general purpose computer is transformed into a special purpose computer that may at least perform the processing shown herein.

Although exemplary embodiments of the present invention have been described in detail hereinabove, it should be understood that many variations and modifications of the basic inventive concept herein described, which may be apparent to those skilled in the art, will still fall within the spirit and scope of the exemplary embodiments of the present invention as defined in the appended claims.

What is claimed is:

1. A method for tuning to a radio broadcast frequency, comprising:
   determining whether a condition for requiring tuning information is satisfied;

computing tuning information using received signal strength indication (RSSI) values of signals received if a condition for requiring tuning information is satisfied, wherein the tuning information comprises a threshold of RSSI; and tuning to a radio broadcast frequency corresponding to an RSSI greater than the threshold of RSSI.

2. The method of claim 1, wherein the condition for requiring tuning information is determining when movement to a new local area where the tuning information is changed.

3. The method of claim 1, wherein determining whether a condition for requiring tuning information is satisfied comprises;

checking whether a connectable service network, or a current service network, when a portable terminal is turned on, is identical to a previously connected service network to which the portable terminal was connected; and comparing local area information regarding the current service network with local area information regarding the previously connected service network if a connectable service network, or a current service network, is not identical to a previously connected service network.

4. The method of claim 1, wherein the local areas comprises countries.

5. The method of claim 1, further comprising:

identifying a connected service network and local area information when reception of a radio broadcast is requested;

determining whether tuning information corresponding to the identified local area information is stored in the tuning information table;

computing tuning information using RSSI values of signals received with the desired frequency range if tuning information corresponding to the identified local area information is not stored; and tuning to a frequency of the requested radio broadcast according to the computed tuning information and receiving broadcast signals through the tuned frequency.

6. The method of claim 5, further comprising:

storing the computed tuning information in the tuning information table if tuning information corresponding to the identified local area information is not stored.

7. A portable terminal comprising:

a radio broadcast receiver for receiving radio broadcast signals through a tuned frequency;

a radio frequency (RF) communication unit for performing communication with a connectable service network, or a current service network; and a controller for determining whether a condition for requiring tuning information is satisfied, computing the tuning information using received signal strength indication (RSSI) values of signals received if a condition for requiring tuning information is satisfied, wherein the tuning information comprises a threshold of RSSI, wherein the controller tunes to a radio broadcast frequency corresponding to an RSSI greater than the threshold of RSSI.

8. The portable terminal of claim 7, wherein the condition for requiring tuning information is determining as to whether a portable terminal with a radio function is moved to local areas where the tuning information is changed.

9. The portable terminal of claim 7, wherein the controller checks whether a connectable service network, or a current service network is identical to a previously connected service network to which the portable terminal was connected, when the portable terminal is turned on, and compares local area information regarding the current service network with local area information regarding the previously connected service network if a connectable service network, or a current service network, is not identical to a previously connected service network.

10. The portable terminal of claim 7, wherein the controller ascertains that the condition for requiring tuning information is satisfied if the portable terminal is moved among countries.

11. The portable terminal of claim 7, wherein the controller identifies local area information through a connected service network when radio broadcasting is requested, determines whether tuning information corresponding to the identified local area information is stored in the tuning information table, and computes tuning information if tuning information corresponding to the identified local area information is not stored.

12. A portable terminal comprising:

a processor in communication with a memory, the memory including code which when accessed by the processor causes the processor to:

determine whether a condition for requiring tuning information is satisfied compute tuning information using received signal strength indication (RSSI) values of signals received if a condition for requiring tuning information is satisfied, wherein the tuning information comprises a threshold of RSSI; and tune to a frequency corresponding to an RSSI greater than the threshold of RSSI.

13. The portable terminal of claim 12, wherein the tuning information further comprises a Signal-to-Noise Ratio (SNR) value.

14. The method of claim 1, wherein the tuning information further comprises a Signal-to-Noise Ratio (SNR) value.

15. The portable terminal of claim 7, wherein the tuning information further comprises a Signal-to-Noise Ratio (SNR) value.

16. The method of claim 14, wherein the SNR value is determined to minimize noise levels, with respect to the signals within the frequency range as:

Noise level=RSSI−SNR where the RSSI is a received signal strength indication (RSSI) value, and 0 dB$\leq$SNR $\leq$127 dB.

17. The method of claim 14, further comprising:

storing the computed tuning information in a tuning information table.

18. The method of claim 17, wherein the tuning information table comprises:

thresholds, SNR values, and local area information.

19. The portable terminal of claim 15, wherein the SNR value is determined to minimize noise levels, with respect to the signals within a desired frequency band as:

Noise level=RSSI−SNR where the RSSI is a received signal strength indication (RSSI) value, and 0 dB$\leq$SNR $\leq$127 dB.

20. The portable terminal of claim 15, further comprising:

a storage unit for storing the computed tuning information in a tuning information table, wherein the storage unit stores the tuning information table comprising thresholds, SNR values, and local area information.

* * * * *

UNITED STATES PATENT AND TRADEMARK OFFICE
CERTIFICATE OF CORRECTION

| | |
|---|---|
| PATENT NO. | : 8,489,050 B2 |
| APPLICATION NO. | : 12/629236 |
| DATED | : July 16, 2013 |
| INVENTOR(S) | : Kyu Sung Han |

It is certified that error appears in the above-identified patent and that said Letters Patent is hereby corrected as shown below:

In the Claims:

Column 10, Claim 12, Line 23 should read as follows:
--...information is satisfied;...--

Signed and Sealed this
Seventeenth Day of September, 2013

Teresa Stanek Rea
*Deputy Director of the United States Patent and Trademark Office*